(12) United States Patent
Noya et al.

(10) Patent No.: US 8,101,333 B2
(45) Date of Patent: Jan. 24, 2012

(54) METHOD FOR FORMATION OF MINIATURIZED PATTERN AND RESIST SUBSTRATE TREATMENT SOLUTION FOR USE IN THE METHOD

(75) Inventors: Go Noya, Kakegawa (JP); Ryuta Shimazaki, Shizuoka (JP); Masakazu Kobayashi, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 149 days.

(21) Appl. No.: 12/311,725

(22) PCT Filed: Oct. 12, 2007

(86) PCT No.: PCT/JP2007/069977
§ 371 (c)(1),
(2), (4) Date: Apr. 9, 2009

(87) PCT Pub. No.: WO2008/047719
PCT Pub. Date: Apr. 24, 2008

(65) Prior Publication Data
US 2010/0021700 A1  Jan. 28, 2010

(30) Foreign Application Priority Data
Oct. 19, 2006 (JP) ................................. 2006-285312

(51) Int. Cl.
*G03F 7/00* (2006.01)
*G03F 7/004* (2006.01)
*G03F 7/032* (2006.01)
*G03F 7/40* (2006.01)

(52) U.S. Cl. .................. 430/270.1; 430/273.1; 430/312; 430/322; 430/330; 430/331; 430/905; 430/906; 430/909

(58) Field of Classification Search ............... 430/270.1, 430/273.1, 312, 330, 322, 331, 905, 906, 430/909
See application file for complete search history.

(56) References Cited

U.S. PATENT DOCUMENTS

| | | | | |
|---|---|---|---|---|
| 3,700,623 A | * | 10/1972 | Keim | 525/328.3 |
| 3,833,531 A | * | 9/1974 | Keim | 524/458 |
| 4,053,512 A | * | 10/1977 | Panzer et al. | 525/353 |
| 4,350,759 A | * | 9/1982 | Fitzgerald et al. | 430/630 |
| 4,407,790 A | | 10/1983 | Oakes et al. | |
| 4,537,831 A | * | 8/1985 | Di Stefano | 428/514 |
| 4,583,989 A | * | 4/1986 | Ueda et al. | 8/543 |
| 5,002,857 A | | 3/1991 | Toyama et al. | |
| 5,064,749 A | | 11/1991 | Matsumoto et al. | |
| 5,326,672 A | | 7/1994 | Tanaka et al. | |
| 5,977,041 A | | 11/1999 | Honda | |
| 6,017,872 A | | 1/2000 | Pedersen et al. | |
| 6,201,093 B1 | | 3/2001 | Messner et al. | |
| 6,368,421 B1 | | 4/2002 | Oberlander et al. | |
| 6,395,849 B1 | * | 5/2002 | Kato et al. | 526/219.5 |
| 6,555,607 B1 | | 4/2003 | Kanda et al. | |
| 6,579,657 B1 | * | 6/2003 | Ishibashi et al. | 430/270.1 |
| 6,593,063 B1 | * | 7/2003 | Tanaka et al. | 430/311 |
| 7,125,547 B2 | * | 10/2006 | Holmes-Farley et al. | 424/78.18 |
| 7,189,783 B2 | * | 3/2007 | Kozawa et al. | 525/61 |
| 7,419,773 B2 | | 9/2008 | Naitou et al. | |
| 7,528,200 B2 | * | 5/2009 | Schile | 525/523 |
| 7,547,747 B2 | * | 6/2009 | Hashimoto et al. | 525/328.2 |
| 7,585,610 B2 | * | 9/2009 | Nozaki et al. | 430/270.1 |
| 7,745,077 B2 | * | 6/2010 | Thiyagarajan et al. | 430/14 |
| 7,745,093 B2 | | 6/2010 | Nishibe et al. | |
| 2003/0096725 A1 | | 5/2003 | Tsibouklis et al. | |
| 2005/0284502 A1 | * | 12/2005 | Watanabe et al. | 134/2 |
| 2006/0124586 A1 | | 6/2006 | Kobayashi et al. | |
| 2006/0188805 A1 | | 8/2006 | Nozaki et al. | |
| 2007/0010409 A1 | | 1/2007 | Zhang et al. | |
| 2007/0010412 A1 | | 1/2007 | Zhang et al. | |
| 2008/0193876 A1 | | 8/2008 | Sawada et al. | |
| 2008/0193880 A1 | | 8/2008 | Nishibe et al. | |
| 2010/0028803 A1 | * | 2/2010 | Sugimoto et al. | 430/270.1 |
| 2010/0028817 A1 | | 2/2010 | Noya et al. | |
| 2011/0165523 A1 | | 7/2011 | Wang et al. | |

FOREIGN PATENT DOCUMENTS

| | | | |
|---|---|---|---|
| EP | 930342 A2 | * | 7/1999 |
| JP | 62-215942 A | | 9/1987 |
| JP | 63170405 A | * | 7/1988 |
| JP | 6-222570 A | | 8/1994 |
| JP | 7-140674 A | | 6/1995 |
| JP | 7-142349 A | | 6/1995 |
| JP | 7-335519 A | | 12/1995 |
| JP | 8-8163 A | | 1/1996 |
| JP | 10-73927 A | | 3/1998 |
| JP | 11-184099 A | | 7/1999 |
| JP | 2000282005 A | * | 10/2000 |
| JP | 2000-338685 A | | 12/2000 |
| JP | 2001-19860 A | | 1/2001 |
| JP | 2001-281863 A | | 10/2001 |
| JP | 2001-312060 A | | 11/2001 |
| JP | 2005-148597 A | | 6/2005 |
| JP | 2005-300853 A | | 10/2005 |

(Continued)

OTHER PUBLICATIONS

Office Action mail date Dec. 8, 2010 for U.S. Appl. No. 12/311,724.

(Continued)

*Primary Examiner* — Amanda C. Walke
(74) *Attorney, Agent, or Firm* — Sangya Jain

(57) ABSTRACT

The present invention provides a method for miniaturizing a pattern without seriously increasing the production cost or impairing the production efficiency. This invention also provides a fine resist pattern and a resist substrate-treating solution used for forming the fine pattern. The pattern formation method comprises a treatment step. In the treatment step, a resist pattern after development is treated with a resist substrate-treating solution containing an amino group-containing, preferably, a tertiary polyamine-containing water-soluble polymer, so as to reduce the effective size of the resist pattern formed by the development. The present invention also relates to a resist pattern formed by that method, and further relates to a treating solution used in the method.

15 Claims, No Drawings

FOREIGN PATENT DOCUMENTS

| | | | |
|---|---|---|---|
| JP | 2006-11054 | A | 1/2006 |
| JP | 2006-58600 | A | 3/2006 |
| JP | 2009224559 | A * | 10/2009 |
| WO | WO 2006/019135 | A1 | 2/2006 |

OTHER PUBLICATIONS

International Search Report (Form PCT/ISA/210) for PCT/JP2007/0069978 date mailed Nov. 6, 2007, which corresponds to U.S. Appl. No. 12/311,724.

International Search Report (Form PCT/ISA1210) for PCT/JP2009/066035 date mailed Oct. 20, 2009, which corresponds to U.S. Appl. No. 13/063,666.

English Language Abstract from JPO of JP 62-215942 A.

Office Action mail date May 29, 2009 for U.S. Appl. No. 10/536,209.

Pages 208 and 226 from Hawley's Condenced Chemical Dictionary, 13th Edition/revised by Richard J. Lewis, Sr., 1997.

* cited by examiner

METHOD FOR FORMATION OF MINIATURIZED PATTERN AND RESIST SUBSTRATE TREATMENT SOLUTION FOR USE IN THE METHOD

This application is a United States National Stage Patent Application under 35 U.S.C. §371 of International Patent Application No. PCT/JP2007/069977, filed Oct. 12, 2007, which claims priority to Japanese Patent Application No. 2006-285312, filed Oct. 19, 2006, the contents of all documents being hereby incorporated herein by reference.

TECHNICAL FIELD

The present invention relates to a method for forming a resist pattern, and also relates to a resist substrate-treating solution used in the method. In detail, this invention relates to a method for forming a pattern fined by chemical treatment applied to a resist pattern employed for manufacture of semiconductor devices, flat panel displays (FPDs) such as liquid crystal display elements, charge-coupled devices (CCDs), color filters, magnetic heads and the like; and the invention also relates to a resist substrate-treating solution used in that method.

BACKGROUND ART

In extensive fields including the manufacture of semiconductor integrated circuits such as LSIs, the preparation of FPD screens, and the production of circuit boards for color filters, thermal heads and the like, photolithography has hitherto been used for formation of fine elements or for microfabrication. In the photolithography, a positive- or negative-working photosensitive resin composition is used for resist pattern formation. As the positive-working photoresist, a photosensitive resin composition comprising an alkali-soluble resin and a photosensitive substance of quinonediazide compound, for example, is widely used.

Meanwhile, in recent years in manufacturing fine electronic devices, increased integration density and highly accelerated processing speed in LSIs have led to design rules requiring quarter-micron- or finer-scale fabrication rather than half-micron-scale fabrication, which the design rules formerly required. Since conventional light for exposure such as visible light or near UV light (wavelength: 400 to 300 nm) cannot fully cope with the design rules requiring finer fabrication, it is necessary to use radiation of shorter wavelength such as far UV light emitted from a KrF excimer laser (248 nm), an ArF excimer laser (193 nm) or the like, an X-ray or an electron beam. Accordingly, lithographic processes using the radiation of shorter wavelength have been proposed and gradually getting used in practice. To cope with the design rules requiring finer fabrication, the photoresist used in microfabrication must be a photosensitive resin composition capable of giving a pattern of high resolution. Further, it is also desired that the photosensitive resin composition be improved not only in resolution but also in sensitivity and in accuracy on shape and dimension of the pattern. In view of this, as a radiation-sensitive resin composition having sensitivity to the radiation of short wavelength and giving a pattern of high resolution, a "chemically amplified photosensitive resin composition" has been proposed. The chemically amplified photosensitive resin composition comprises a compound that generates an acid when exposed to radiation, and hence when the radiation is applied, the compound generates an acid and the acid serves as a catalyst in image-formation to improve sensitivity. Since the chemically amplified photosensitive resin composition is thus advantageous, it has been getting popularly used in place of conventional photosensitive resin compositions.

However, although photosensitive resin compositions have been thus studied and developed to increase the fineness in fabrication, finer fabrication is still required of design rules. Accordingly, it is studied from a new viewpoint to further fine resist patterns.

For example, Patent documents 1 to 3 describe a method in which a pattern obtained by a usual process is further covered with a homogeneous coating layer to narrow the width of the trench pattern or to reduce the diameter of the contact hole. This method makes it possible to further fine the patterns having been already fined to the utmost limit by the photolithographic pattern-formation method using the photosensitive resin composition.

However, in the method disclosed in those Patent documents, a coating composition is spread on a pattern prepared beforehand, and then heated or exposed to light to harden, so that the pattern is thickened. Accordingly, it is necessary to perform an additional step in a process of the method. Therefore, in view of production cost and efficiency, there is room for improvement.

[Patent document 1] Japanese Patent Laid-Open No. H10 (1998)-73927
[Patent document 2] Japanese Patent Laid-Open No. 2001-19860
[Patent document 3] Japanese Patent Laid-Open No. 2005-300853

DISCLOSURE OF INVENTION

Problem to be Solved by the Invention

In consideration of the aforementioned problem, it is an object of the present invention to provide a method for miniaturizing a pattern without seriously increasing the production cost or impairing the production efficiency.

Means for Solving Problem

The present invention resides in a pattern formation method for forming a fine resist pattern, comprising a step in which a resist pattern after development is treated with a resist substrate-treating solution containing an amino group-containing water-soluble polymer, so as to reduce the effective size of said resist pattern formed by the development.

The present invention also resides in a fined resist pattern formed by the steps of: developing an imagewise exposed resist substrate with a developer, and then treating the developed resist substrate with a resist substrate-treating solution containing an amino group-containing water-soluble polymer.

The present invention further resides in a resist substrate-treating solution for reducing the effective size of a resist pattern, which comprises a solvent and an amino group-containing water-soluble polymer and with which a resist pattern formed by development is treated to reduce the effective size thereof.

Effect of the Invention

According to the present invention, a pattern can be fined without seriously increasing the production cost or impairing the production efficiency. In a production process according to the present invention, it is unnecessary to introduce a new apparatus and it is possible to employ relatively inexpensive materials, and hence a fined pattern can be produced without increasing the production cost.

BEST MODE FOR CARRYING OUT THE INVENTION

The pattern formation method according to the present invention is described below in detail.

In the pattern formation method of the invention, a resist pattern after development is treated with a resist substrate-treating solution. There is no particular restriction on the process by which a resist pattern is developed to obtain the pattern to be treated, and hence any process can be used. Accordingly, the lithographic process for preparing the pattern to be treated can be carried out in any known manner of forming a resist pattern from a conventional positive- or negative-working photosensitive resin composition. Below described is a typical process for forming a pattern to be treated with the resist substrate-treating solution of the present invention.

First, a photosensitive resin composition is coated on a surface, which can be pretreated, if necessary, of a substrate, such as a silicon substrate or a glass substrate, according to a known coating method such as spin-coating method, to form a photosensitive resin composition layer. Prior to the coating of the photosensitive resin composition, an antireflection film can be beforehand formed by coating under or above the resist. The antireflection film can improve the section shape and the exposure margin.

Any known photosensitive resin composition can be used in the pattern formation method of the present invention. Representative examples of the compositions usable in the present invention include: a composition comprising a quinonediazide type photosensitive substance and an alkali-soluble resin, a chemically amplified photosensitive resin composition (which are positive-working compositions); a composition comprising a photosensitive functional group-containing polymer such as polyvinyl cinnamate, a composition comprising an azide compound such as an aromatic azide compound or a bisazide compound with a cyclized rubber, a composition comprising a diazo resin, a photo-polymerizable composition comprising an addition-polymerizable unsaturated compound, and a chemically amplified negative-working photosensitive resin composition (which are negative-working compositions).

Examples of the quinonediazide type photo-sensitive substance used in the positive-working composition comprising a quinonediazide type photosensitive substance and an alkali-soluble resin include: 1,2-benzoquinonediazide-4-sufonic acid, 1,2-naphthoquinonediazide-4-sufonic acid, 1,2-naphthoquinonediazide-5-sufonic acid, and sufonic esters or amides thereof. Examples of the alkali-soluble resin include: novolak resin, polyvinyl phenol, polyvinyl alcohol, and copolymers of acrylic acid or methacrylic acid. The novolak resin is preferably prepared from one or more phenols such as phenol, o-cresol, m-cresol, p-cresol and xylenol in combination with one or more aldehydes such as formaldehyde and paraformaldehyde.

Either positive- or negative-working chemically amplified photosensitive resin composition can be used in the pattern formation method of the present invention. The chemically amplified resist generates an acid when exposed to radiation, and the acid serves as a catalyst to promote chemical reaction by which solubility to a developer is changed within the areas irradiated with the radiation to form a pattern. For example, the chemically amplified photosensitive resin composition comprises an acid-generating compound, which generates an acid when exposed to radiation, and an acid-sensitive functional group-containing resin, which decomposes in the presence of acid to form an alkali-soluble group such as phenolic hydroxyl or carboxyl group. The composition may comprise an alkali-soluble resin, a crosslinking agent and an acid-generating compound.

The photosensitive resin composition layer formed on the substrate is prebaked, for example, on a hot plate to remove solvent contained in the composition, to form a photoresist film. The prebaking temperature depends upon the solvent and the photosensitive resin composition, but is normally 20 to 200° C., preferably 50 to 150° C.

The photoresist film is then subjected to exposure through a mask, if necessary, by means of known exposure apparatus such as a high-pressure mercury lamp, a metal halide lamp, an ultra-high pressure mercury lamp, a KrF excimer laser, an ArF excimer laser, a soft X-ray irradiation system, and an electron beam lithography system.

After the exposure, baking treatment may be carried out, if necessary, and then development such as paddle development is carried out to form a resist pattern. The resist is normally developed with an alkali developer. Examples of the alkali developer include an aqueous solution of sodium hydroxide or tetramethylammonium hydroxide (TMAH). After the development, the resist pattern is rinsed (washed) with a rinse solution, preferably, pure water. The thus-formed resist pattern is employed as a resist for etching, plating, ion diffusion or dyeing, and then, if necessary, peeled away.

The pattern formation method according to the present invention particularly makes it possible to further fine a fine resist pattern. Accordingly, the method of the invention is preferably combined with a lithographic process capable of giving a fine resist pattern, such as, a lithographic process comprising exposure at a wavelength of 250 nm or shorter with a light source of a KrF excimer laser, an ArF excimer laser, an X-ray irradiation system or an electron beam lithography system. Further, the lithographic process preferably produces a resist pattern having a pattern dimension in which a line width of the line-and-space pattern is not more than 300 nm, preferably not more than 200 nm or in which a hole diameter of the contact hole pattern is not more than 300 nm, preferably not more than 200 nm.

The thickness of the resist pattern is properly determined according to the aimed use, but is in the range of generally 0.1 to 5 µm, preferably 0.1 to 2.5 µm, more preferably 0.2 to 1.5 µm.

In the pattern formation method of the present invention, the resist pattern after development is treated with a resist substrate-treating solution containing an amino group-containing water-soluble polymer. This resist substrate-treating solution reduces the effective size of the resist pattern formed by the development. As the amino group-containing water-soluble polymer, any polymer can be used as long as it contains an amino group and is soluble in water. There is no particular restriction on the number of the amino groups contained in the polymer. However, in order to enhance the effect on reducing the pattern size, the number of nitrogen atoms is preferably 5 to 5000, more preferably 5 to 2000 per molecule of the polymer.

The amino group-containing water-soluble polymer is preferably a polyamine represented by the following formula:

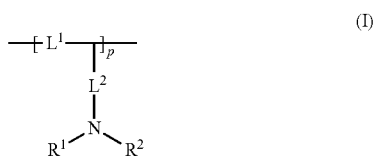

in which $L^1$ and $L^2$ are divalent linking groups such as single bonds or divalent functional groups. There is no particular restriction on the number of carbon atoms contained in $L^1$ and $L^2$, but each contains preferably 0 to 20 carbon atoms, more preferably 0 to 5 carbon atoms. The groups $L^1$ and $L^2$ are not particularly restricted, but they are generally hydrocarbon groups, preferably alkylene groups or arylene groups, more preferably alkylene groups. In the formula, $R^1$ and $R^2$ may be any functional groups. There is no particular restriction on the number of carbon atoms contained in $R^1$ and $R^2$, but they are generally hydrogen atoms or hydrocarbon groups and hence each contains preferably 0 to 20 carbon atoms, more preferably 0 to 5 carbon atoms. The groups $R^1$ and $R^2$ are not particularly restricted, but they are generally hydrocarbon groups, preferably alkyl groups or aryl groups, more preferably alkyl groups. The groups $R^1$ and $R^2$ may be combined to form a ring, or otherwise $R^1$ or $R^2$ may be combined with carbon atoms in $L^1$ or $L^2$, respectively, to form a ring. In the above formula, p is a number indicating polymerization degree. If necessary, each of the groups $L^1$, $L^2$, $R^1$ and $R^2$ may have a substituent group such as hydroxyl, a carboxyl group, an amino group, a carbonyl group or an ether group. In one molecule of the polymer, two or more different groups may serve as each of $L^1$, $L^2$, $R^1$ and $R^2$. Further, in the case where the groups $L^1$, $L^2$, $R^1$ and $R^2$ contain carbon atoms, the number of the carbon atoms is selected within such a range that the polymer can be dissolved in water at a predetermined concentration. For example, $L^1$ and $L^2$ are preferably an alkylene group and methylene, respectively. Examples of the amino group-containing water-soluble polymer include polyallylamine, poly-N-methylallylamine, poly-N,N'-dimethylallylamine, and poly(N-methyl-3,5-piperidinediylmethylene). The polymerization degrees of those polymers are not particularly restricted, and can be desirably determined according to various conditions such as the monomer structure, concentration of the resist substrate-treating solution and the resist compound. However, the number of p in polyallylamine is generally 5 to 500, preferably 10 to 400. The number of p in poly-N,N'-dimethylallylamine is generally 5 to 50, preferably 5 to 30, and that in poly(N-methyl-3,5-piperidinediylmethylene) is generally 5 to 50, preferably 10 to 30. Concrete examples of structures and polymerization degrees of the preferred polymers are shown below. The shown polymers are commercially available from, for example, Nitto Boseki Co., Ltd.

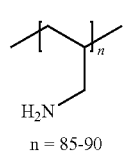

n = 85-90

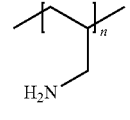

n = 1000-1100

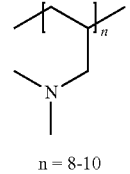

n = 8-10

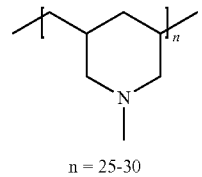

n = 25-30

If neither $R^1$ nor $R^2$ in the formula (I) is a hydrogen atom, namely, if the nitrogen atom in the formula (I) forms a tertiary amino group, the effect of the present invention is enhanced. Accordingly, the polymer having that structure, for example, the polymer of the above (Ic) or (Id) is particularly preferred. Examples of that polymer include poly-N,N'-dimethylallylamine (molecular weight: 800) and poly-(N-methyl-3,5-piperidinediylmethylene) (molecular weight: 3000). Further, various other derivatives of polyallylamine and polymers having structures of pyrazole, vinylpyrrolidone, acrylamide (amide), vinylpyridine and piperidine skeletons can be advantageously used as the amino group-containing water-soluble polymer in the present invention.

According to the requirement, it is possible to use the amino group-containing water-soluble polymer having a desired molecular weight. The molecular weight of the polymer is in the rage of generally 500 to 200000, preferably 1000 to 100000. However, since the proper molecular weight depends upon the main chain structure and the functional groups, it is often possible to use the amino group-containing water-soluble polymer having a molecular weight out of the above range.

Two or more amino group-containing water-soluble polymers can be used in combination, if necessary.

There is no particular restriction on the concentration of the amino group-containing water-soluble polymer dissolved in the treating solution, but it is preferred to control the concentration according to what the pattern is used for and how the pattern is used. Generally, the treating solution containing the polymer in a high concentration is apt to shorten the time to complete the treatment, and gives large effect on reducing the effective size of the resist pattern. On the other hand, if the treating solution contains the polymer in a low concentration, it takes a short time to complete rinsing with pure water after the treatment. Further, what kind of the amino group-containing water-soluble polymer is most preferred and how much amount is most preferred are dependent upon the photosensitive resin composition and other conditions. Accordingly, the concentration is preferably so determined that the required characteristics can be obtained in good balance. The optimum concentration of the amino group-containing water-soluble polymer is thus not fixed, but is generally in the range of 0.01 to 5%, preferably 0.05 to 2%, more preferably 0.1 to 10% based on the total weight of the resist substrate-treating solution.

The treatment of resist pattern by use of the resist substrate-treating solution can be performed, for example, by immersing the resist substrate in the treating solution or by subjecting the resist substrate to dip-coating or paddle-coating with the treating solution. The time for which the resist substrate is treated with the treating solution, namely, the treatment time is not particularly limited. However, to enhance the effect on reducing the effective size of the pattern, the treatment time is preferably not less than 10 seconds, more preferably not less than 60 seconds. The upper limit of the treatment time is not particularly limited, but the treatment time is preferably not more than 300 seconds in view of the production efficiency.

There is also no particular restriction on the temperature of the treating solution. However, in view of the effect on reducing the effective size of the resist pattern and of uniformity in the reduced size, the temperature is generally in the range of 5 to 50° C., preferably 20 to 30° C.

The resist substrate-treating solution according to the present invention comprises, if necessary, a solvent as well as the aforementioned amino group-containing water-soluble polymer. There is no particular restriction on the solvent, and any solvent can be used. However, in consideration of affinity with the developer and the rinse solution, water is preferably used. However, for improving wettability, a small amount of organic solvent can be added as a cosolvent. Examples of the cosolvent include alcohols such as methanol and ethanol, ketones such as acetone and methyl ethyl ketone, and esters such as ethyl acetate. If necessary, other auxiliary components can be incorporated. For example, acidic or basic substances and surfactants can be added unless they impair the effect of the present invention.

In the pattern formation method according to the present invention, the resist substrate after development is preferably rinsed with pure water, namely, is preferably subjected to rinse step, immediately before and/or after treated with the treating solution containing the amino group-containing water-soluble polymer of the present invention. The rinse step before the treatment with the treating solution is carried out for the purpose of washing out a developer remaining on the resist pattern. In order to prevent the developer from contaminating the treating solution and to treat the resist substrate with a minimum amount of the treating solution, the resist substrate after development is preferably rinsed with pure water before treated with the treating solution. On the other hand, the rinse step after the treatment with the treating solution is for the purpose of washing out the treating solution. Particularly in the case where the treating solution has a high concentration, the rinsing with pure water is preferably carried out after the treatment with the treating solution so that the resist pattern may not undergo troubles in the subsequent steps, for example, so that the treating solution remaining on the resist surface may not cause problems in the etching step.

The rinsing with pure water can be carried out in a desired manner. For example, the resist substrate is immersed in the rinse solution, or otherwise the rinse solution is dropped or sprayed onto the substrate surface while the substrate is being rotating. The rinsing with pure water can be performed either before or after, or otherwise both before and after the treatment with the treating solution.

In the present invention, the resist pattern after development is treated with the aforementioned treating solution. After the development or after the rinsing with pure water, the resist pattern is normally not dried and immediately treated with the treating solution. However, if necessary, before treated with the treating solution, the resist pattern can be dried immediately after the development or after the rinsing procedure subsequent to the development. Even so, the effect of the invention can be obtained.

According to the present invention, the resist pattern is so fined that the line width or the hole diameter is reduced generally by 5 Å or more, preferably by 10 Å or more. In the pattern formation method of the present invention, the resist pattern is fined by a mechanism different from that of the conventional method in which the pattern is covered with a composition containing a crosslinking agent for miniaturizing. In fact, the resist substrate-treating solution of the present invention contains no crosslinking agent. The mechanism by which the resist pattern is fined in the pattern formation method of the present invention is yet to be revealed clearly. However, it is presumed that a layer be formed on an unexposed area of the resist surface and/or that the resist be soaked and swollen with the component of the treating solution.

The resist pattern having an effective size thus reduced by the pattern formation method of the present invention is then further processed according to the aimed use. The pattern formation method of the present invention by no means restricts the subsequent steps, and hence the resist pattern can be processed in known manners.

The pattern formed by the method of the present invention can be employed for manufacture of semiconductor devices, flat panel displays (FPDs) such as liquid crystal displays, charge-coupled devices (CCDs), color filters, magnetic heads and the like, in the same manner as the pattern formed by the conventional method is employed for.

The present invention is further explained by use of the following Examples, but they by no means restrict the embodiments of the present invention.

COMPARATIVE EXAMPLE

An anti-reflection film-forming composition (AZ KrF-17B ["AZ" is trade mark, same as above], manufactured by AZ Electronic Materials (Japan) K.K.) was spin-coated on an 8-inch silicon wafer by means of a spin coater (manufactured by Tokyo Electron Limited), and then prebaked on a hot-pate at 180° C. for 60 seconds to obtain a 800 Å-thick film. The thickness was measured by a thickness monitor (manufactured by Prometrix). On the thus-obtained anti-reflection film, a 248 nm-exposure type chemically amplified photoresist containing a polymer of polystyrene skeleton (AZ DX 6270P, manufactured by AZ Electronic Materials (Japan) K.K.) was spin-coated and then prebaked on a hot-pate at 125° C. for 90 seconds to obtain a 0.67 μm-thick resist film. The obtained resist film was then subjected to exposure by means of a reduced projection exposure apparatus (FPA-3000EX5, manufactured by Canon Inc.) with ½ annular at 248 nm, and thereby a line-and-space pattern of 150 nm width was formed. Thereafter, the resist substrate was baked on a hot-pate at 130° C. for 90 seconds, and then paddle development was carried out with 2.38 wt. % aqueous solution of tetramethylammonium hydroxide (developer AZ 300MIF, manufactured by AZ Electronic Materials (Japan) K.K.) at 23° C. for 1 minute. Successively, after rinsed with pure water, the resist substrate was spin-dried to obtain a resist pattern.

EXAMPLES

After developed in the same manner as in Comparative Example, (a) the resist substrate was not rinsed with pure water and immediately treated with the resist substrate-treating solution for 60 seconds, or (b) the resist substrate was not rinsed with pure water and immediately treated with the resist substrate-treating solution for 60 seconds, and then rinsed with pure water for 15 seconds, or otherwise (c) the resist substrate was rinsed with pure water and treated with the resist substrate-treating solution for 60 seconds, and then rinsed again with pure water for 15 seconds. The resist substrate-treating solution used in each treatment contained the amino group-containing water-soluble polymer in various concentrations shown in Table 1.

The width of the pattern obtained in Comparative Example and that obtained in each Example were measured by means of a highly-precise apparent dimension measuring system S-9200 (manufactured by Hitachi, Ltd.), to obtain the difference of the pattern width (in terms of Å) between the former and the latter. The results were as set forth in Table 1.

TABLE 1

Evaluation of pattern width difference according to concentration of resist-treating solution

| | | Concentration of resist-treating solution | | | | | |
|---|---|---|---|---|---|---|---|
| | Procedures | 0% | 0.01% | 0.1% | 1% | 2% | 5% |
| (Ia) | develop - treat | 0 | 5 | 8 | melt. | melt. | melt. |
| | develop - treat - rinse | | 3 | 6 | 8 | 7 | 9 |
| | develop - rinse - treat - rinse | | 3 | 6 | 7 | 7 | 7 |
| (Ib) | develop - treat | 0 | 5 | 8 | melt. | melt. | melt. |
| | develop - treat - rinse | | 2 | 6 | 7 | 7 | 8 |
| | develop - rinse - treat - rinse | | 3 | 5 | 6 | 6 | 7 |
| (Ic) | develop - treat | 0 | 7 | 15 | melt. | melt. | melt. |
| | develop - treat - rinse | | 5 | 13 | 13 | 15 | 17 |
| | develop - rinse - treat - rinse | | 5 | 12 | 13 | 15 | 16 |
| (Id) | develop - treat | 0 | 6 | 10 | melt. | melt. | melt. |
| | develop - treat - rinse | | 6 | 12 | 11 | 14 | 14 |
| | develop - rinse - treat - rinse | | 4 | 12 | 12 | 13 | 15 |

Remark) melt.: the resist surface was melted.

The invention claimed is:

1. A pattern formation method for forming a fine resist pattern, comprising a step in which a resist pattern after development is treated with a resist substrate-treating solution containing an amino group-containing water-soluble polymer, so as to reduce the effective size of said resist pattern formed by the development, further where the water-soluble polymer is selected from a group consisting of poly-N-methylallylamine, poly-N,N'-dimethylallylamine and poly(N-methyl-3,5-piperidinediylmethylene.

2. The pattern formation method according to claim 1 wherein said resist pattern is treated with said resist substrate-treating solution for 10 to 300 seconds.

3. The pattern formation method according to claim 1, characterized by further comprising the step of washing with pure water immediately before or after the treatment with said resist substrate-treating solution.

4. The pattern formation method according to claim 1, wherein said resist pattern has a pattern dimension in which a line width of the line-and-space pattern or a hole diameter of the contact hole pattern is not more than 300 nm.

5. A fined resist pattern formed by the steps of: developing an imagewise exposed resist substrate with a developer, and then treating the developed resist substrate with a resist substrate-treating solution containing an amino group-containing water-soluble polymer, further where the water-soluble polymer is selected from a group consisting of poly-N-methylallylamine, poly-N,N'-dimethylallylamine and poly(N-methyl-3,5-piperidinediylmethylene.

6. A resist substrate-treating solution for reducing the effective size of a resist pattern, which comprises a solvent and an amino group-containing water-soluble polymer and with which a resist pattern formed by development is treated to reduce the effective size thereof, further where the water-soluble polymer is selected from a group consisting of poly-N-methylallylamine, poly-N,N'-dimethylallylamine and poly(N-methyl-3,5-piperidinediylmethylene.

7. The pattern formation method according to claim 1, wherein the amino group-containing water-soluble polymer is poly-N-methylallylamine.

8. The pattern formation method according to claim 1, wherein the amino group-containing water-soluble polymer is poly-N,N'-dimethylallylamine.

9. The pattern formation method according to claim 1, wherein the amino group-containing water-soluble polymer is poly(N-methyl-3,5-piperidinediylmethylene).

10. The pattern formation method according to claim 5, wherein the amino group-containing water-soluble polymer is poly-N-methylallylamine.

11. The pattern formation method according to claim 5, wherein the amino group-containing water-soluble polymer is poly-N,N'-dimethylallylamine.

12. The pattern formation method according to claim 5, wherein the amino group-containing water-soluble polymer is poly(N-methyl-3,5-piperidinediylmethylene).

13. The composition according to claim 6, wherein the amino group-containing water-soluble polymer is poly-N-methylallylamine.

14. The composition according to claim 6, wherein the amino group-containing water-soluble polymer is poly-N,N'-dimethylallylamine.

15. The composition according to claim 6, wherein the amino group-containing water-soluble polymer is poly(N-methyl-3,5-piperidinediylmethylene).

* * * * *